(12) United States Patent
Izuo et al.

(10) Patent No.: US 6,790,340 B1
(45) Date of Patent: Sep. 14, 2004

(54) METHOD AND APPARATUS FOR RADIATION ASSISTED ELECTROCHEMICAL ETCHING AND ETCHED PRODUCT

(75) Inventors: Shinichi Izuo, Tokyo (JP); Hiroshi Ohji, Tokyo (JP); Kazuhiko Tsutsumi, Tokyo (JP); Patrick James French, Delft (NL)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/009,521

(22) PCT Filed: May 24, 2000

(86) PCT No.: PCT/JP00/03307

§ 371 (c)(1),
(2), (4) Date: Dec. 11, 2001

(87) PCT Pub. No.: WO01/91170

PCT Pub. Date: Nov. 29, 2001

(51) Int. Cl.$^7$ .............................. C25F 3/00; C25F 7/00; C25D 17/00
(52) U.S. Cl. ....................... 205/655; 205/656; 205/666; 204/224 M
(58) Field of Search ................................ 205/655, 656, 205/665, 666

(56) References Cited

U.S. PATENT DOCUMENTS

| 4,482,443 A | 11/1984 | Bacon et al. |
| 4,874,484 A | 10/1989 | Foell et al. |
| 5,318,676 A | * 6/1994 | Sailor et al. ................. 205/655 |
| 5,360,759 A | 11/1994 | Stengl et al. |

FOREIGN PATENT DOCUMENTS

| JP | 7-230983 | 8/1995 |
| JP | 10-256227 | 9/1998 |
| WO | PCT/DE96/01256 | 2/1997 |
| WO | PCT/JP99/00078 | 7/2000 |
| WO | PCT/JP99/00079 | 7/2000 |

OTHER PUBLICATIONS

U.S. patent application Ser. No. 09/658,484, Ohji et al., filed Sep. 8, 2000.
U.S. patent application Ser. No. 09/658,864, Ohji et al., filed Sep. 8, 2000.
H.W. Lau et al.; "High aspect ratio silicon pillars fabricated by electrochemical etching and oxidation of macroporous silicon", *Elsevier Science S.A.*, pp. 29–31 (1996), (no month).
Lehmann, V.; "The Physics of Macropore Formation in Low Doped n–Type Silicon", *J. Electrochem. Soc.*, vol. 140, No. 10, pp. 2836–2843 (Oct. 1993).
Lehmann, V. et al.; "Formation Mechanism and Properties of Electrochemically Etched Trenches in n-type Silicon", *J. Electrochem. Soc.*, vol. 137, No. 2, pp. 653–659 (Feb. 1990).

* cited by examiner

*Primary Examiner*—Donald R. Valentine
(74) *Attorney, Agent, or Firm*—Leydig, Voit & Mayer, Ltd.

(57) ABSTRACT

An electrochemical etching system has an etching bath for holding an n-type silicon substrate with a first surface of the substrate in contact with hydrofluoric acid, an electrode positioned in the hydrofluoric acid, a power source having a positive pole connected to the silicon substrate and a negative pole connected to the electrode, and an illumination unit having a light source for illumination of a second surface of the silicon substrate. The illumination unit illuminates the second surface of the silicon substrate with an illumination intensity of 10 m W/cm$^2$ or more. A ratio of a maximum illumination to a minimum illumination of the second surface of the silicon substrate is 1.69:1 or less. With the etching system, pores and/or trenches of a certain size and shape can be formed in an entire area of the silicon substrate having a diameter of more than three inches.

16 Claims, 12 Drawing Sheets

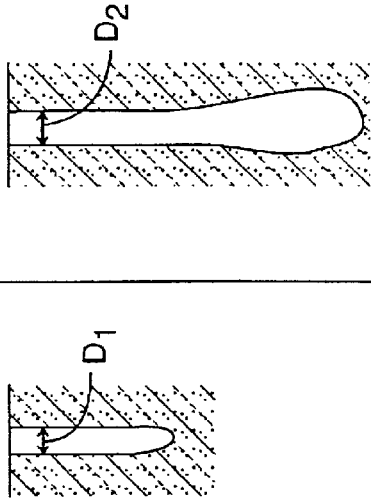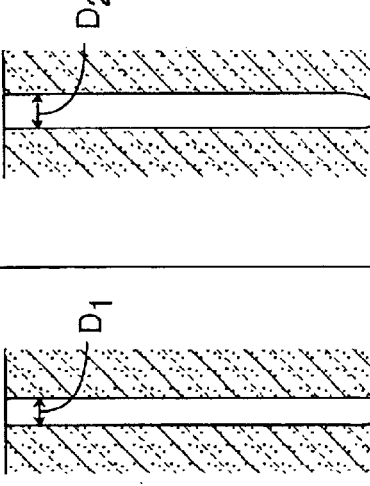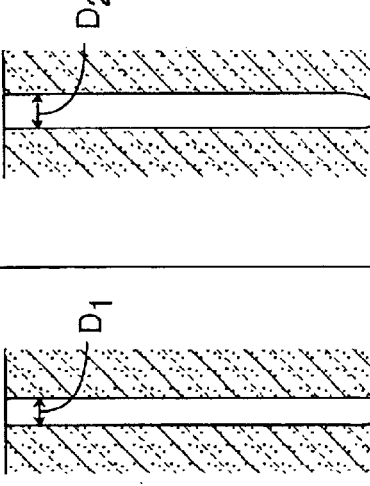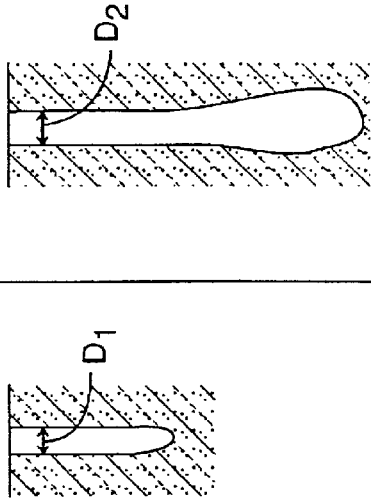
Fig.2A
Fig.2B

Fig.2C

| ENLARGED VIEW | MINIMUM ILLUMINATION | MAXIMUM ILLUMINATION |
|---|---|---|
| DIAMETER (DIAMETER RATIO) | $D_1 = 3.2 \mu m$ | $D_2 = 4.8 \mu m$ ($1.5 D_1$) |
| ILLUMINATION (ILLUMINATION RATIO) | $I_{MIN} = 65 mW/cm^2$ | $I_{MAX} = 146 mW/cm^2$ ($I_{MAX}/I_{MIN} = 2.25$) |

Fig.2D

| ENLARGED VIEW | MINIMUM ILLUMINATION | MAXIMUM ILLUMINATION |
|---|---|---|
| DIAMETER (DIAMETER RATIO) | $D_1 = 3.0 \mu m$ | $D_2 = 3.3 \mu m$ ($1.1 D_1$) |
| ILLUMINATION (ILLUMINATION RATIO) | $I_{MIN} = 60 mW/cm^2$ | $I_{MAX} = 73 mW/cm^2$ ($I_{MAX}/I_{MIN} = 1.21$) |

*Fig.10A*  *Fig.10B*
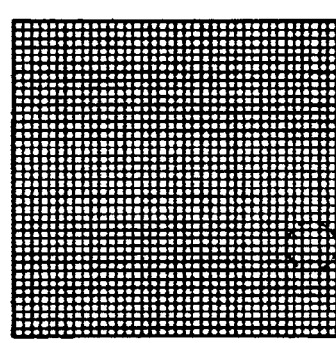
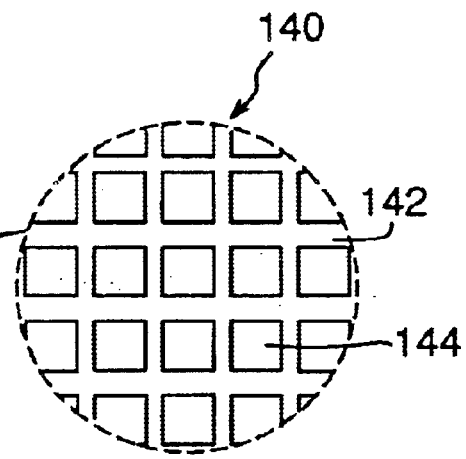

US 6,790,340 B1

METHOD AND APPARATUS FOR RADIATION ASSISTED ELECTROCHEMICAL ETCHING AND ETCHED PRODUCT

TECHNICAL FIELD OF THE INVENTION

The present invention relates to an electrochemical etching method and apparatus. In particular, the present invention relates to a method and apparatus in which an n-type silicon substrate is exposed at one surface to an electrolyte and at an opposite surface to light, so that a pore (hole) or a trench (groove) of a certain size and shape is formed in the substrate as an etching current flowing in the substrate is controlled by the light. Also, the present invention relates to a product, e.g., a semiconductor device, made by the use of the electrochemical etching method. It is to be understood that the present invention is preferably applicable to a method and apparatus for an electrochemical etching for the formation of pores or trenches having a diameter or width of 50 nm or more in the n-type silicon substrate. However, the present invention is not limited by the size of the pore or trench.

BACKGROUND OF THE INVENTION

Japanese Patent Publication No. 2,694,731 discloses an electrochemical etching system which uses light to form small pores or trenches in an n-type doped silicon substrate. The system has a holder for holding the n-type doped silicon substrate (silicon wafer) with one surface of the substrate contacted with an electrolyte (hydrofluoricacid). Also, the holder retains an electrode in the electrolyte so that the electrode opposes the silicon substrate. With this etching system, the silicon substrate is positively biased and the electrode in the electrolyte is negatively biased. The opposite side of the silicon substrate away from the electrolyte is exposed to light, causing holes in he silicon substrate. The holes travel a boundary region between the silicon substrate and the electrolyte to resolve the boundary portion of the silicon substrate. This means that an arrangement of a masking barrier (coating) with one or more apertures (pits) on the surface of the silicon substrate adjacent to the electrolyte, results in the formation of the pores or trenches in the substrate portions, corresponding to the apertures.

The Journal of Electrochemical Society, No. 140, October 1993, pp. 2836–2843 discloses a back light device for the illumination of silicon substrate. The light device has a lamp for emitting light, an infrared filter for removing infrared light from the emitted light, and a convex lens for collimating the light emitted from the lamp.

Also, the Journal of Electrochemical Society, No. 137, February 1990, pp. 653–659 discloses an electrochemical etching device which uses a 100 W tungsten lamp for the back light device.

Further, Japanese Patent Publication No. 11-509644 discloses a system for manufacturing devices with electrochemical etching. Japanese Patent Publication No. 11-154737 discloses a manufacturing system for incorporating a capacitance in the trench formed by the electrochemical etching technique. The Journal of Electrochemical Society, No. 137, February 1990, pp. 653–659 discloses an embodiment in which an aperture or trench of 20 ×20 mm is formed in the silicon substrate by the etching technique.

In order to mass-produce various devices using the electrochemical etching system, the system is required to make an even etching for the entire surface of a relatively large silicon substrate with a diameter of three inches or more, for example, and thereby form pores or trenches of a certain size and shape at every portion of the substrate.

Using the system disclosed in the Japanese Patent Publication No. 2,694,731 and the 100 W tungsten lamp in the Journal of Electrochemical Society, No. 140, trials were made to form pores of a certain diameter at every portion in the three-inch silicon substrate. The etched silicon substrate was viewed by the microscope, which showed that pores were formed only in a limited part of the silicon substrate. Also, the resultant pores have different sizes and shapes. Although further trials were made under different conditions in voltage, current and illumination, uniform pores failed to be formed over the entire portion of the silicon substrate.

Another object of the present invention is to provide devices, e.g., semiconductor device and sensors, such as acceleration sensor, manufactured through such electrochemical etching method.

SUMMARY OF THE INVENTION

In order to attain the objects, an electrochemical etching system according to one aspect of the present invention has an illumination unit including a light source for illuminating an illumination surface of an n-type silicon substrate with an illumination of 10 $mW/cm^2$ or more. According to the embodiment, even for the silicon substrate having a diameter of three inches or more, pores and/or trenches to be formed in the silicon substrate develops toward the illumination surface with a uniform cross section. Also, the formed pore and/or trench has a smooth surface.

In another aspect of the electrochemical etching system of the present invention, on the illumination surface of the silicon substrate, a ratio of the maximum illumination to the minimum illumination is 1.69:1 or less. With the arrangement, even for the silicon substrate having a diameter of three inches or more, a constant etching current flows in the silicon substrate, which ensures that the formed pore and/or trench has a substantially constant size (cross section and depth).

In another aspect of the electrochemical etching system of the present invention, a reference electrode is positioned in the electrolyte. A voltage detector with an elevated impedance is electrically connected between the reference electrode and the n-type silicon substrate. With the arrangement, by controlling the voltage between the reference electrode and the silicon substrate, the voltage to be applied to the silicon substrate can be controlled.

In another aspect of the electrochemical etching system of the present invention, an illumination unit has an illumination controller for controlling an illumination to the other surface of the silicon substrate. With the arrangement, the size of the pore and/or trench to be formed in the silicon substrate can be controlled.

In another aspect of the electrochemical etching system of the present invention, the illumination controller controls an amount of light emitted from the light source. With the arrangement, the illumination to the silicon substrate can be adjusted precisely.

In another aspect of the electrochemical etching system of the present invention, the illumination controller, which is positioned between the light source and the silicon substrate, has a modulator for modulating light emitted from the light source. With the arrangement, where the light source is unable to control an amount of light to be emitted therefrom, the illumination of the silicon substrate can be controlled.

In another aspect of the electrochemical etching system of the present invention, the system includes a current detector for detecting a current applied from the power source to the silicon substrate, and a circuit for controlling the emitting light according to the current detected by the current detector. With the arrangement, the silicon substrate can be etched precisely.

In another aspect of the electrochemical etching system of the present invention, the system includes a unit for maintaining a stable condition of the hydrofluoricacid (e.g., concentration and temperature). With the arrangement, the hydrofluoricacid has a stable condition, which in turn ensures the constant size of the pore and/or trench formed in the silicon substrate.

In another aspect of the electrochemical etching system of the present invention, the system has a metal plate positioned on the other surface of the silicon substrate. The metal plate is formed with a number of regularly arranged openings so that light from the illumination unit toward the silicon substrate is transmitted therethrough. With the arrangement, the other surface of the silicon substrate is illuminated uniformly, which ensures the silicon substrate to be applied with a constant voltage.

In another aspect of the electrochemical etching system of the present invention, the metal plate is made of electrically conductive material and is positioned adjacent to the other surface of the silicon substrate. With the arrangement, the power source and the silicon substrate are electrically connected through the metal plate.

In another aspect of the electrochemical etching system of the present invention, the metal plate is formed integrally on the other surface of the silicon substrate. With the electrochemical etching system, the metal plate is formed precisely by the physical or chemical vapor deposition and also the lithography used in the manufacturing process for semiconductor. Also, the openings can be formed with a great precision.

In another aspect of the electrochemical etching system of the present invention, the metal plate is formed independent of the silicon substrate. With the arrangement, the manufacturing process of the silicon substrate can be simplified.

An electrochemical etching method of the present Invention which includes the steps of making one surface of an n-type silicon substrate into contact with an electrolyte, illuminating the other surface of the silicon substrate, and controlling an etching current by the illumination to form a pore or trench in the one surface of the silicon substrate is characterized in that the method further comprises illuminating the the other surface of the silicon substrate with an illumination of 10 mW/cm$^2$ or more.

In another aspect of the electrochemical etching method, the method includes arranging a metal plate with a number of regularly arranged openings on the other surface of the n-type silicon substrate and illuminating the other surface of the n-type silicon substrate through the openings.

In another aspect of the electrochemical etching method, a ratio of a maximum illumination to a minimum illumination to the other surface of the silicon substrate is 1.69:1 or less.

With the methods, even the silicon substrate having a diameter of three inches or more is formed with a substantially the same size pores and/or trenches in an entire area of the substrate.

Another electrochemical etching method of the present invention which has the steps of making one surface of an n-type silicon substrate into contact with an electrolyte, illuminating the other surface of the silicon substrate, and controlling an etching current by the illumination to form pores or trenches in the one surface of the silicon substrate is characterized in that the method further comprises a first step in which the other surface of the silicon substrate is illuminated with a first illumination of 10 mW/cm$^2$ or more to form the pores or trenches extending toward the other surface of the silicon substrate, and a second step in which, after the first step, the other surface of the silicon substrate is illuminated with another illumination higher than the first illumination to extend the pores or trenches laterally to connect the pores or trenches to each other. According the method, the vertical pores can be connected at bottom portion thereof to each other.

In view of above, according to the electrochemical etching method of the present invention, the shapes of the pores and/or trenches can be controlled so precisely. Also, an enlarged substrate can be etched. Then, the devices manufactured by the electrochemical etching system has pores and/or trenches of which shape is well controlled, ensuring a high performance and its inexpensiveness.

BRIEF DESCRIPTION OF THE DRAWINGS

FIGS. 2A to 2E are drawings, each of which showing a cross sectional shape of a pore formed in the silicon substrate, a diameter of the pore, and an illumination in Experiment 2;

FIGS. 10A and 10B are a schematic plan view and a detail view of the grid electrode plate for use in the electrochemical etching system according to the seventh embodiment;

DETAILED DESCRIPTION OF THE PREFERRED EMBODIMENTS

Figure 1:
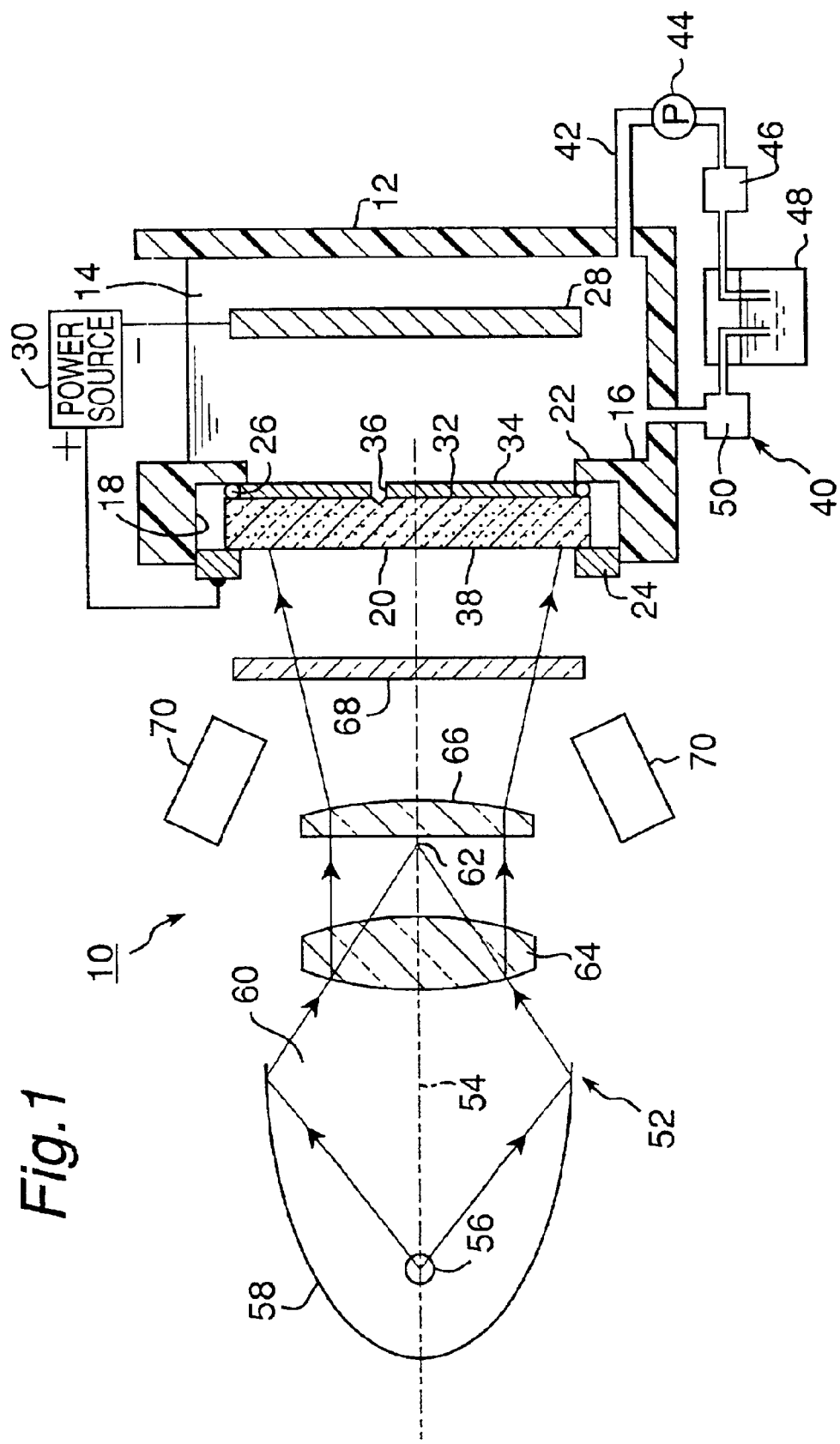
FIG. 1 is a schematic cross sectional view of an electrochemical etching system according to the first embodiment.

With reference to the drawings, descriptions will be made to the preferred embodiments of the present invention. Like reference numerals indicate like parts throughout the drawings.

First Embodiment

Referring to FIG. 1, there is shown an electrochemical etching system for an n-type silicon substrate (silicon wafer) 10 according to the first embodiment of the present invention. The etching system 10 includes an etching bath 12 for receiving an etching electrolyte 14 of 5wt % hydrofluoricacid. A surface portion of the etching bath 12, making a contact with the etching electrolyte 14, is coated with an appropriate material, e.g., polytetrafluoroethylene, that resists against hydroflluoricacid. Alternatively, the etching bath 12 may fully be made of material that resists against hydroflluoricacid.

The etching bath 12 is formed at its wall 16 with a round opening 18 for receiving a disc-like n-type silicon wafer 20 therein. The wall 16 includes an annular flange 22 running along an inner periphery of the opening 18 and projecting toward a center of the opening 18. In order to secure the silicon substrate 20, a fixing ring 24 is provided behind the substrate 20 to force the silicon substrate 20 against the annular flange 22. Preferably, a suitable sealing member, e.g., O-ring 26, is positioned between the annular flange 18 and the silicon substrate 20 to prevent the electrolyte 14 from leaking therebetween.

One electrode 28 (cathode) is provided in the electrolyte 14 so that it opposes to the silicon substrate 20 received in the opening 18. The silicon substrate 20 is used for the other electrode or anode. The electrode (cathode) 28 and the silicon substrate (anode) 20 are electrically connected to a DC power supply 30, so that a suitable voltage can be applied between the electrode (cathode) 28 and the silicon wafer (anode) 20. Preferably, the fixing ring 24 for fixing the silicon substrate 20 in position is made of an electrically conductive material for the electrical connection between the silicon substrate 20 and the power source 30.

A surface 32 of the silicon wafer 20 adjacent to the electrolyte 14 is coated with a masking barrier or resist mask 34. The masking barrier 34 is made of a suitable masking material, e.g., silicon nitride, platinum, or gold, which is deposited by a suitable deposition technique, e.g., chemical or physical vapor deposition. The surface 32 of the silicon substrate is formed with one or more pits or apertures 36 corresponding to an etching pattern of the silicon substrate 20. This causes that etching or resolving proceeds at the associated portions of the silicon substrate exposed in the pits 36 toward the opposite surface 38 of the silicon substrate, forming pores or trenches in silicon substrate. Preferably, the pits 36 are formed by a suitable technique such as wet etching, dry etching, and laser machining.

The etching system 10 includes an electrolyte unit 40. The electrolyte unit 40 has a circulation passage or tube 42 which is fluidly connected at its opposite ends to the etching bath 12. The circulation passage 42 has a pump 44 for pumping the electrolyte 14 through the circulation passage 42, a filter 46 for removing foreign substances from the electrolyte 14 running in the circulation passage 42, a buffer 48 for maintaining a constant amount of electrolyte 14 in the etching bath 12, and a thermostat 50 for maintaining a temperature of electrolyte 14 in the etching bath 12 constant. The electrolyte unit 40 maintains a necessary quality of the electrolyte 14 in the etching bath 14, ensuring a stable etching of the silicon substrate 20 described below. The etching system 10 further includes a back light unit 52. The back light unit 52 is used to concentrate holes generated in the silicon substrate 20 at a leading edge of each pore where the further etching or resolving of the substrate proceeds locally. For this purpose, the back light unit 52 has an illumination source or lamp 56, e.g., tungsten lamp, located on an central axis 54 of the circular opening 18 of the etching bath 12 and a semi-oval reflector or mirror 58 of which opening 60 is directed toward the circular opening 18 of the etching bath 12. A curvature of the mirror 58 is determined so that light from the lamp 54 is reflected by the mirror 58 to focus on a certain point (focal point) 62 on the axis 54. A collimator lens 64 is opposed to the opening 60 of the mirror 58 so that light from the mirror 58 is collimated by the collimator lens 64. Another convex lens 66 is positioned between the collimator lens 64 and the silicon substrate 20 so that the collimated light is then extended toward the silicon substrate 20, causing the back surface of the silicon substrate, away from the electrolyte, to be illuminated. Preferably, as shown in FIG. 1, a filter 68 is provided to remove a part of light, e.g., light having a wavelength of 1.1 $\mu$m or more, in order to prevent the silicon substrate 20 from being overheated. Also, a suitable fan or fans 70 may be provided adjacent to the silicon substrate 20 for the cooling of the substrate.

Hereinafter, a brief description will be made to the operation of the etching system 10 so constructed. In operation, the silicon substrate 20 is secured in the opening 18 of the etching bath 12. Then, the electrolyte 14 is filled in the etching bath 12. Then, the power source 30 applies a certain voltage between the electrode 28 and the silicon substrate 20, and the illumination lamp 52 illuminates the back surface 38 of the silicon substrate 20. This causes holes in the silicon substrate to concentrate at the portions of the silicon substrate, exposed in the pits 36. As a result, a local etching or resolving is initiated at each of the exposed portions and then advanced straightly toward the opposite back surface 38 of the silicon substrate 20.

Experiment 1

Tests were made to evaluate a relation between an illumination and configurations of the resultant pores.

1. Conditions

Test conditions were as follows:

i. Silicon substrate

Diameter of silicon substrate: 76 mm

Thickness of silicon substrate: 625 $\mu$m

Thickness of mask barrier: 5,000 Å

Diameter of pit: 2 $\mu$m ii. Electrolyte

5wt % hydrofluoricacid iii. Illumination 0, 5, 10, 20, 50, 100, and 200 mW/cm$^2$ The illumination was measured on the back surface of the silicon substrate, using a Power Meter commercially available from Advantest Corporation under the name of Air Light Multi-Power Q8221, with a calibrated wavelength of 760 nm.

iv. Voltage (Voltage applied between the electrode and the silicon substrate)

2.0 volts and 4.0 volts v. Etching period 20 minutes

2. Evaluation

The etched silicon was cut and the its cross section, in particular, the longitudinal cross section of pore, was observed using a microscope. Using the microscopic photographs, diameters of several pores were measured at a certain distance of 5 $\mu$m away from the front surface of the silicon substrate.

3. Results

The test results are shown in the following Table 1:

TABLE 1

| Illumination | Voltage Applied | |
|---|---|---|
| (mW/cm$^2$) | 2.0 volts | 4.0 volts |
| 0 | C | C |
| 5 | B | B |
| 10 | A | A |
| 20 | A | A |
| 30 | A | A |
| 50 | A | A |
| 100 | A | A |
| 200 | A | A |

Table 1, evaluation A, B and C means as follows:

A: Each pore had a diameter of more than 50 nm. Also, each pore had a smooth surface and extended substantially straightly toward the back surface.

B: Each pore had a diameter of less than 50 nm. Also, each pore extended obliquely toward the back surface.

C: No pore was formed.

4. Conclusion

The table 1 shows that the illumination affects on the resultant pore configuration significantly. Also revealed is that, in order to form a pore running straightly toward the back surface of the substrate and having an even cross section, the illumination should be set 10 mW/cm$^2$ while keeping a suitable voltage between the electrode and the silicon substrate.

In order to provide the illumination of 10 mW/cm$^2$ for the entire back surface of the silicon substrate, a source. Anther lamp such as tungsten lamp or mercury lamp can be used instead provided that it ensures the illumination of 10 mW/cm$^2$.

An application of an increased voltage between the silicon substrate and the electrode may result in pores having a diameter of 50 nm or more in the silicon substrate. However, this etching is different from the electrochemical etching technique according to the present invention.

Experiment 2

Tests were made to evaluate an affect of illumination on the configuration of pores in the silicon substrate.

1. Conditions

Test conditions were as follows:

i. Silicon substrates

Number of substrates used: 4

Diameter of silicon substrate: 76 mm

Thickness of silicon substrate: 625 $\mu$m

Thickness of mask barrier: 5,000 Å

Diameter of pit: 2 $\mu$m ii. Electrolyte 5 wt % hydrofluoricacid iii. Illumination The illumination was measured on the back surface of the silicon substrate. Then, identified were the maximum and minimum illumination points of the substrate. The illumination measuring device was identical to that used in Experiment 1.

iv. Voltage (Voltage applied between the electrode and the silicon substrate)

2.0 volts

V. Etching period 20 minutes

2. Evaluation

The etched silicon was cut and the its cross section, in particular, the longitudinal cross section of pore, was observed using a microscope. Using the microscopic photographs, diameters of several pores were measured at a certain distance of 5 $\mu$m away from the front surface of the silicon substrate.

3. Results

The test results are shown in FIGS. 2A–2D. As shown in the tables in the drawings, where a ratio ($I_{MAX}/I_{MIN}$) of the maximum illumination $I_{MAX}$ and the minimum illumination $I_{MIN}$ being 1.96 and 2.25, the configurations of pores formed at the maximum illumination point and the minimum illumination point were quite different from each other. Also, the diameter of the pore at the maximum illumination was extended toward the leading end of the pore.

Where the ratio of the maximum illumination and the minimum illumination being 1.69, although the pores had separate diameters slightly different from the other, they have substantially the same depth. Also, the pores had substantially smooth surfaces. Likewise, where the ratio of the maximum illumination and the minimum illumination being 1.21, the pores had substantially the same size and they had smooth surfaces.

4. Conclusion

The result of experiment 2 shows that, even for the silicon substrate having a diameter of 3 inches or more, pore or trenches having substantially the same diameter are formed at every place in the silicon substrate provided that the ratio of the maximum illumination and the minimum illumination is 1.69 or less.

Improvements/Modification

Figure 3:
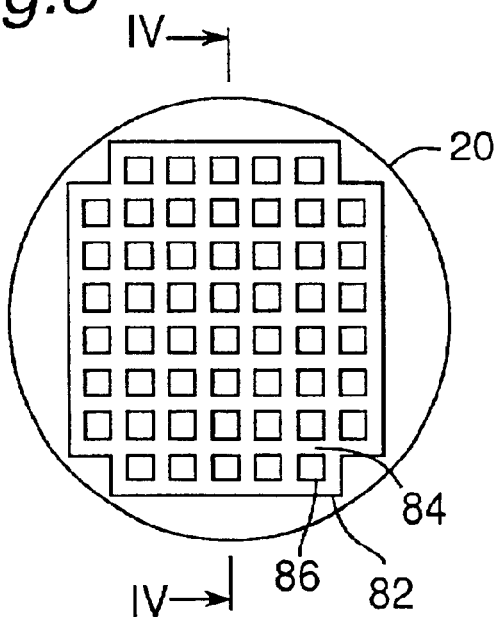
FIG. 3 is an exaggerated plan view of a grid electrode layer positioned on a back surface of the silicon substrate.
Figure 4:
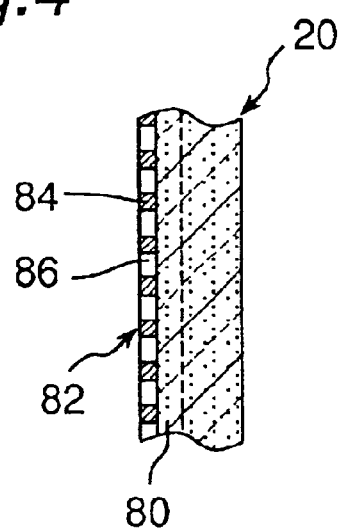
FIG. 4 is an enlarge cross sectional view taken along lines IV—IV in FIG. 3, showing the grid electrode layer in an exaggerated fashion.

FIGS. 3 and 4 show the silicon substrate 20. The silicon substrate 20 has an n+ layer 80 in the back surface 38 opposing to the back light unit 52, in which ion is injected using a known donor ion injection technique. A metal layer (metal plate or grid metal layer) 82, made of conductive material, is provided on the n+ layer 80. Preferably, as best shown in FIG. 3, the metal layer 82 is in the form of grid. Preferably, the grid metal layer 82 is made by depositing the conductive material through a film formation technique such as chemical or physical vapor deposition and then forming openings 86 so that a grid 84 remains between openings through a technique such as photolithography.

The grid layer 82 so defined has a smaller contact resistance against the n-type silicon substrate 20, which allows a constant voltage to be applied through the grid metal layer 20 to the entire portion of the silicon substrate 20 which is in contact with the grid metal layer 82.

Although the opening 86 in the grid 84 is not limited to a specific size, it should be smaller than the thickness of the silicon substrate 20. This is because that the illumination to the silicon substrate 20 decreases with the increase of the width of the grid 84 between the openings 86, which reduces the concentration of the hole in the silicon substrate 20.

Studies conducted by the inventors revealed that, where each line of the grid 84 has a width of 10 $\mu$m and its interval is 90 $\mu$m, a constant voltage can be applied to every portion of the silicon substrate 20, overcoming the problems caused by the reduction of illumination.

Preferably, when using electrode 28 made of platinum, the voltage between the electrode 28 and the silicon substrate 20 is determined so that the n-type silicon substrate 20 is biased higher than the electrode 28 by +1 to +4 volts. This causes pores and trenches to be generated in the substrate more efficiently.

Second Embodiment

Figure 5:
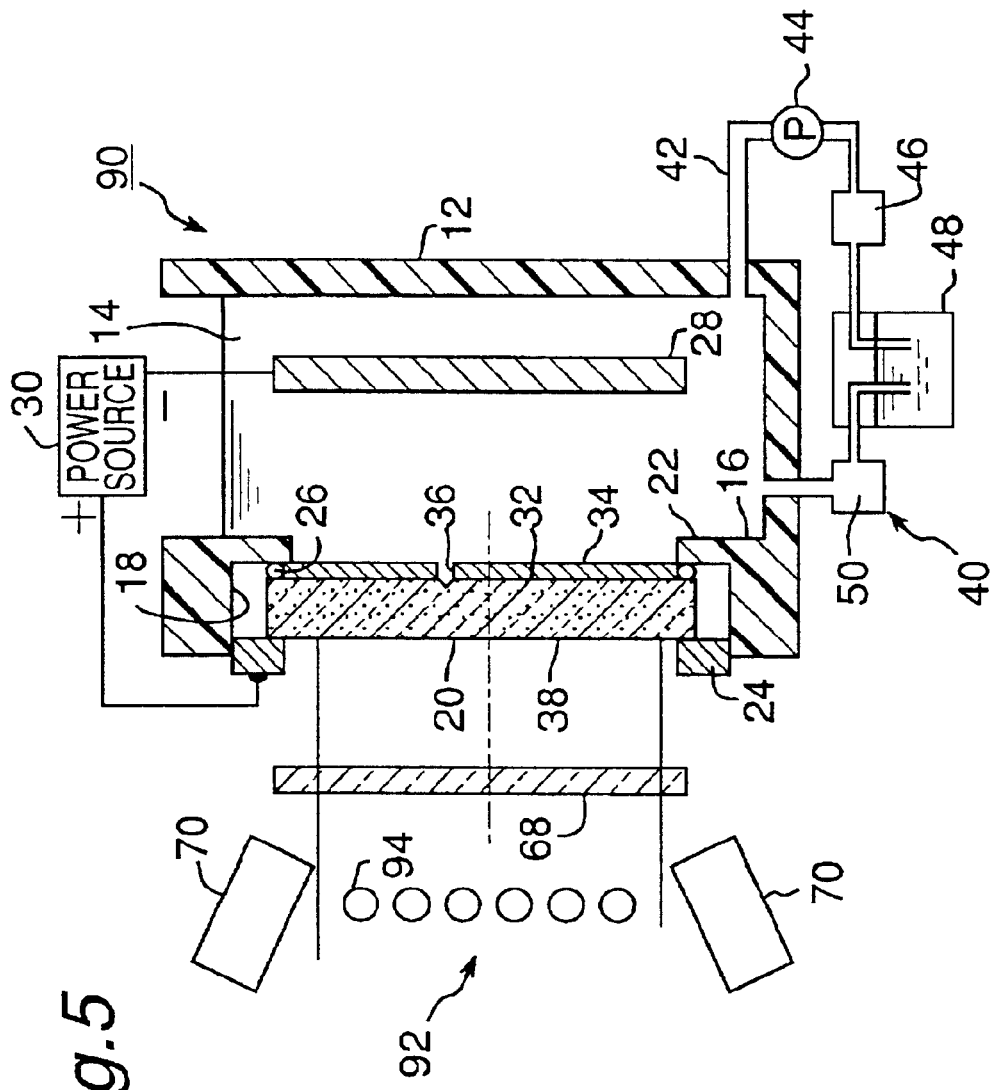
FIG. 5 is a schematic cross sectional view of the electrochemical etching system according to the second embodiment.

Referring to FIG. 5, there is shown another electrochemical etching system 90 according to the second embodiment of the present invention. In this etching system 90, the back light unit 92 includes a plurality of lamps 94 arranged in a lattice on a plane perpendicular to the central axis of the silicon substrate 20 (or on a plane parallel to the silicon substrate 20). With this etching system 90, the back surface of the silicon substrate 20 is illuminated uniformly. Also, the plurality of lamps 94 can be positioned easily so that the ratio of maximum/minimum illumination ratio takes 1.69 or less.

Third Embodiment

Figure 6:
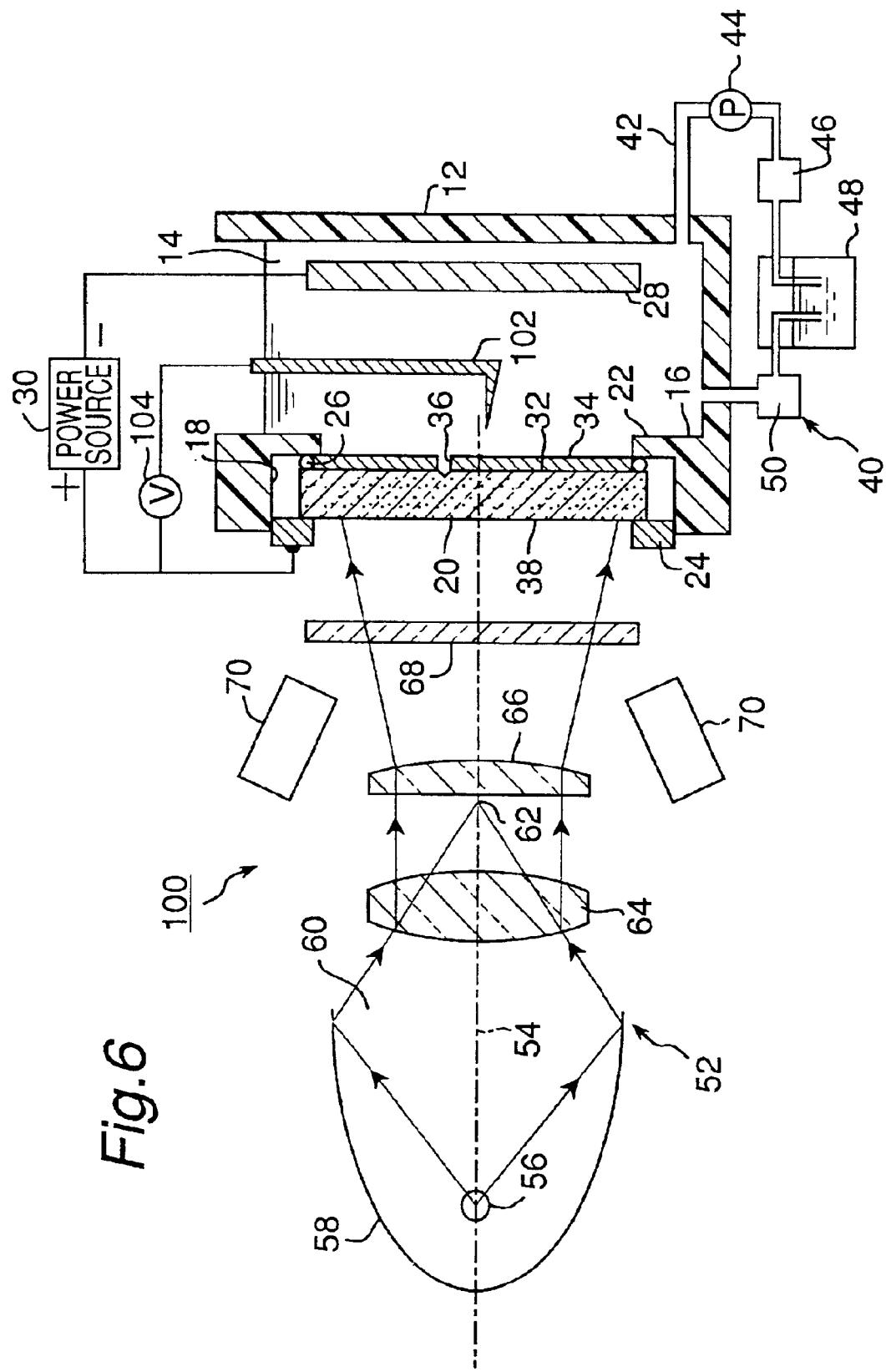
FIG. 6 is a schematic cross sectional view of the electrochemical etching system according to the third embodiment.

Referring to FIG. 6, there is shown another electrochemical etching system 100 according to the third embodiment of the present invention. In this etching system 100, a reference electrode 102, which is positioned in the electrolyte 14 between the silicon substrate 20 and the electrode 28, is electrically connected through a voltage meter 104 to the power source 30 for measuring the voltage to be applied to the silicon substrate 20. Preferably, the voltage meter 104 is designed to provide an elevated impedance between the reference electrode 20 and the silicon substrate 20. In operation of the etching system 100, the power source 30 is controlled so that a constant voltage is applied to the voltage meter 104, ensuring a constant current to flow between the silicon substrate 20 and the electrode 28.

Preferably, the reference electrode 102 is positioned as close as possible to the silicon substrate 20 while leaving a small gap therebetween. This minimizes the electric resistance of the electrolyte 14 between the reference electrode 102 and the silicon substrate 20. Also, this ensures that the voltage applied to the silicon substrate 20 is detected precisely and, thereby, that the configuration of the pore/trench is well controlled.

Fourth Embodiment

Figure 7:
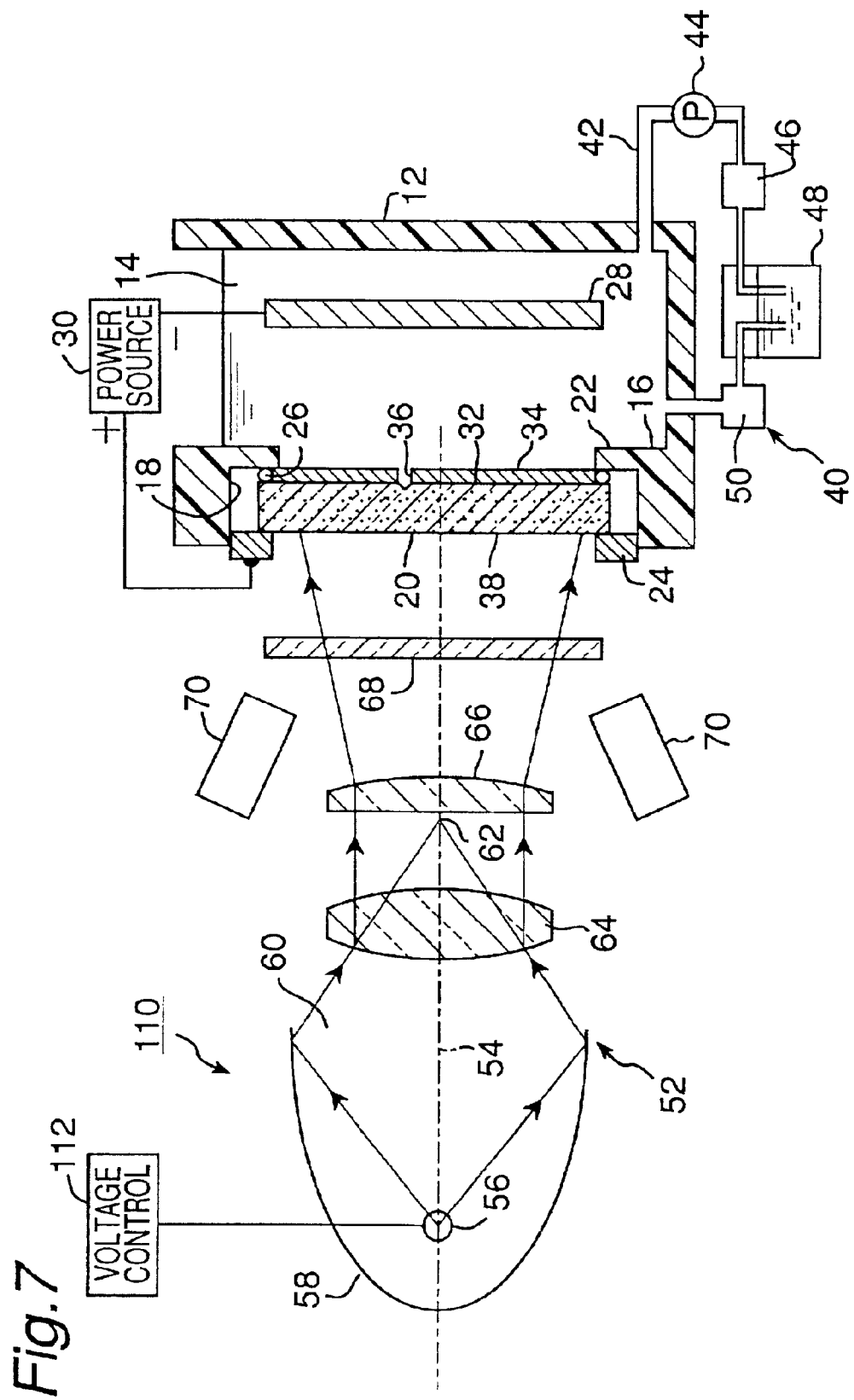
FIG. 7 is a schematic cross sectional view of the electrochemical etching system according to the fourth embodiment.

Referring to FIG. 7, there is shown another electrochemical etching system 110 according to the fourth embodiment of the present invention. In this etching system 110, the illumination lamp 56 is electrically connected to a voltage controller 112 for changing the illumination to the silicon substrate 20. With this etching system 110, an etching current supplied from the power source 30 to the silicon substrate 20 changes in proportion to the illumination. Therefore, by changing the voltage applied to the lamp 56 by the voltage controller 112 and, thereby, the illumination to the silicon substrate 20, the size of the resultant pore and/trench can be varied. Also, a pore and/or trench with an enlarged cavity or cross section at its leading portioin can easily be formed by forming a pore or trench having a uniform cross section and then increasing the illumination and the etching current.

Fifth Embodiment

Figure 8:
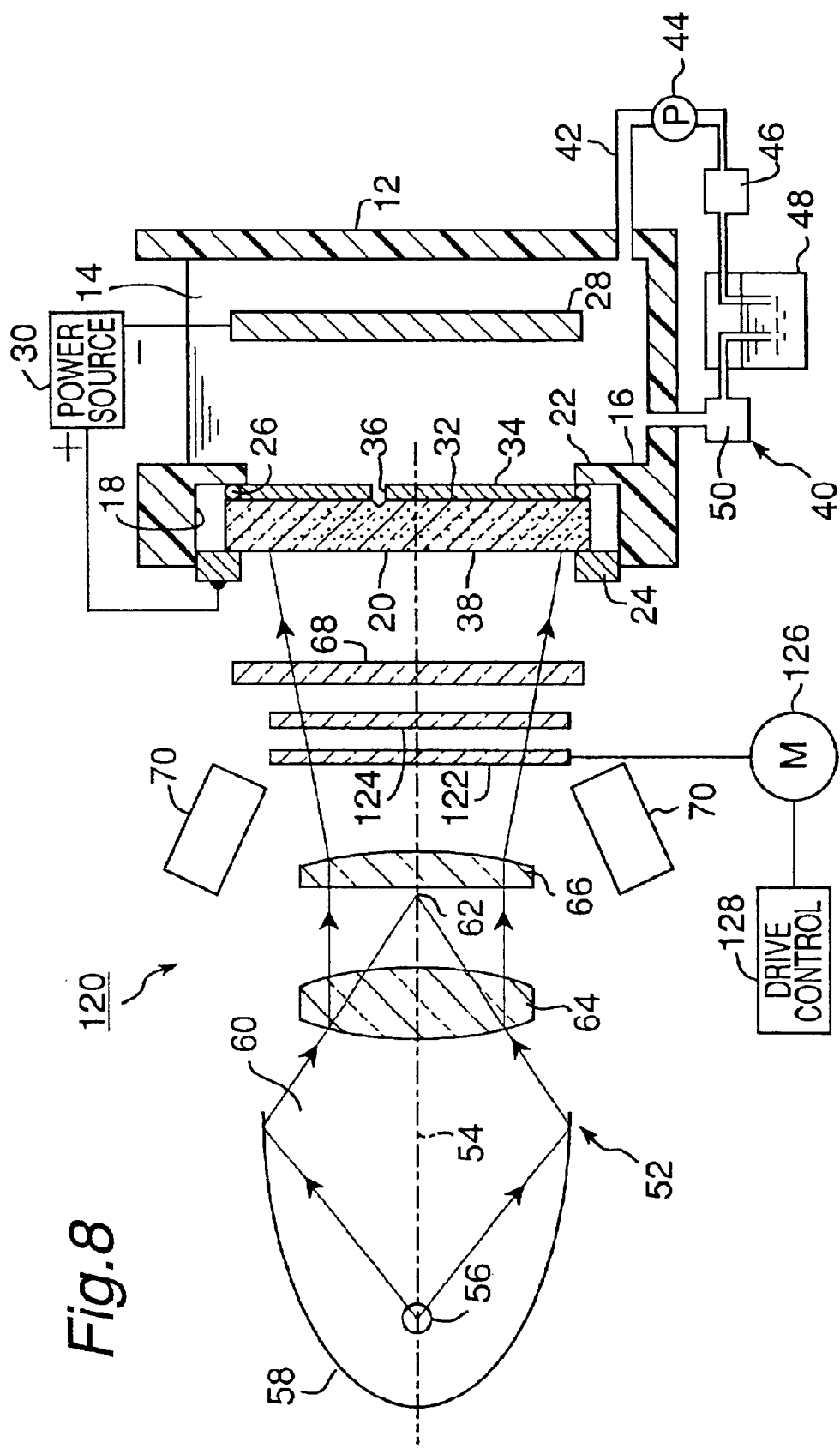
FIG. 8 is a schematic cross sectional view of the electrochemical etching system according to the fifth embodiment.

Referring to FIG. 8, there is shown another electrochemical etching system 120 according to the fifth embodiment of the present invention. This etching system 120 has two polarizing devices or filters 122 and 124 between the convex lens 66 and the filter 68. Also, one of the two polarizing filters 122 and 124 is supported for rotation about a central axis 54 of the silicon substrate 20 relative to the other in order to control a quantity of light passing through the two polarizing filters 122 and 124 and thereby the illumination to the silicon substrate 20. This means that simply by rotating the rotatable filter, rather than controlling the illumination of the lamp 56, the size of the pore and trench formed in the silicon substrate can be controlled.

In this embodiment, the rotatable polarizing filter may be mechanically connected to a drive unit (e.g., motor) 126 for rotating the polarizing filter about the central axis 54, which in turn connected to the controller 128. This allows the controller 128 to control the drive unit 126, positioning the polarizing filter in a desired position.

Sixth Embodiment

Figure 9:
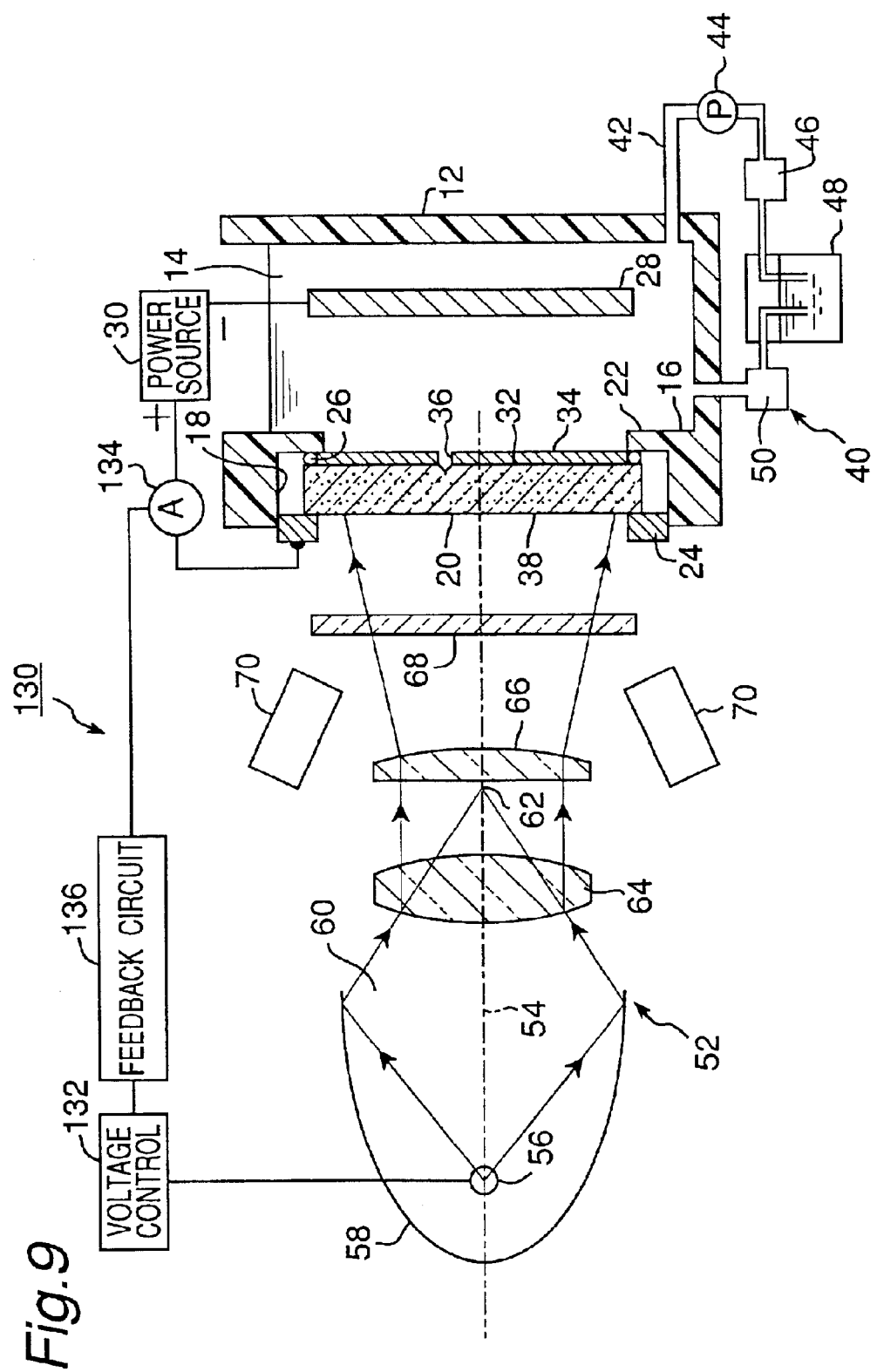
FIG. 9 is a schematic cross sectional view of the electrochemical etching system according to the sixth embodiment.

Referring to FIG. 9, there is shown another electrochemical etching system 130 according to the fifth embodiment of the present invention. In this etching system 130, the illumination lamp 56 is electrically connected to a voltage controller 132 for controlling the voltage applied to the lamp 56. A current detector or amperemeter 134 is electrically connected between the power source 30 and the silicon substrate 20 for detecting the etching current supplied from the power source 30 to the silicon wafer 20. The voltage controller 132 and the amperemeter 134 are electrically connected to each other through a feedback circuit 136.

With this etching system 130, the feedback circuit 136 reads the etching current detected by the amperemeter 134, and then transmits a corresponding signal to the voltage controller 132 for controlling the illumination to the silicon substrate 20. This in turn alters the etching current, changing the shape of the pore and/or trench. As described above, according to the etching system 130, by controlling the illumination, the etching current can be kept constant to form pores and/trenches in a precise manner.

The feedback circuit 136 may be electrically connected to the position controller of the polarizing filter. In this instance, the polarizing filter is rotated according to a signal from the feedback circuit 136, allowing the illumination to the silicon substrate to be controlled in a precise manner.

Seventh Embodiment

Although in the first embodiment the grid metal layer is integrally formed on the back surface of the silicon substrate, it may be formed as an independent member capable of being separated from the silicon wafer. Specifically, FIG. 10A shows a grid metal plate 140 made of an electrically conductive material and FIG. 10B shows a detail view of the grid metal plate. Preferably, as described above, the size of the grid 142 and of the openings 144 in the grid metal plate 140 are determined so that the size of the grid 142 is smaller than the thickness of the silicon substrate.

The grid metal plate 140 is sealingly attached on the back surface of the silicon substrate and then secured by a suitable fixing member. Preferably, the grid metal plate 140 is manufactured integrally with the fixing ring which is used for fixing the silicon substrate to the etching bath. This facilitates the fixing of the grid metal plate 140 to the silicon substrate without any difficulty.

Eighth Embodiment

Figure 11:
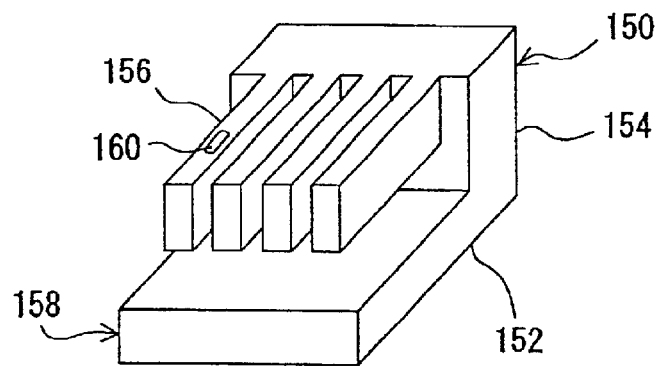
FIG. 11 is a schematic plan view of an acceleration sensor manufactured by the electrochemical etching method according to the eighth embodiment.

FIG. 11 shows an accelerometer or acceleration sensor 150 manufactured by the use of the electrochemical etching system of the present invention. The acceleration sensor 150 has a base 152. The base 152 has a wall 154 extending vertically from the base 152. The wall 154 has a plurality of spaced, cantilever-like, deformable portions 156 extending in parallel from the wall 154. The base 152, wall 154, and deformable portions 156 are formed in a single product 158 by shaping a silicon substrate using the electrochemical etching technique of the present invention. Each of the deformable portions 156 supports a strain member, e.g., piezoelectric member or resistance 160, for measuring a deformation of the deformable portion 156.

In operation, when any acceleration is acted on the acceleration sensor 150, each of the deformable portions 156 sags toward a direction opposing to the acceleration. Then, the deformation of the deformable portion 156 is detected from the change of resistance of the piezoelectric member 160.

Figure 12A:
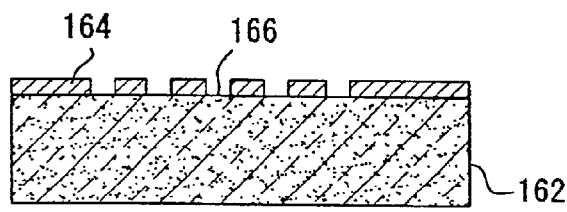
FIGS. 12A to 12E are drawings for describing processes of the electrochemical etching method according to the eighth embodiment.
Figure 12B:
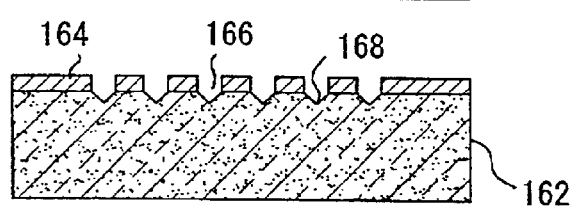

He Referring to FIGS. 12A to 12E, a process for manufacturing the product 158 from the silicon substrate will be described below. At first, prepared is an n-type silicon substrate 162 with a certain thickness (see FIG. 12A). Then, a silicon nitride layer 164 is deposited on one surface of the n-type silicon substrate 162 by the chemical vapor deposition, for example. Next, portions of the nitride layer are removed by the photolithography to form patterning grooves 166 for etching the corresponding portions of the silicon substrate to define the tip end surface and the side surfaces of each of the deformable portions 156. Subsequently, as shown in FIG. 12B, portions of the silicon substrate, exposed in the patterning grooves 166, are etched by wet etching with a suitable alkaline solution or reactive ion etching, for example, forming pits 168 from which the subsequent etching will be initialized.

The silicon substrate 162 with the nitride silicon layer 164 is mounted on the electrochemical etching system for its etching. At this moment, the silicon substrate 162 is positioned so that the nitride silicon layer 164 and the patterning grooves 166 opposes to the etching electrolyte, i.e., hydrofluoricacid, and light, is illuminated to the back surface of the silicon substrate 162. The opposing electrode may be made of platinum.

Figure 12C:
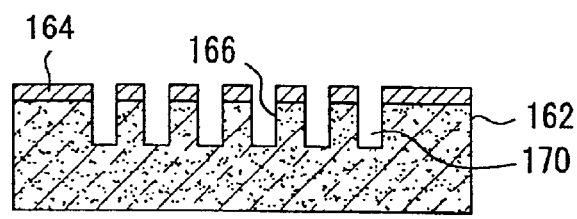

The etching is performed in two steps. In the first etching process, the platinum electrode and the silicon substrate are biased so that the silicon substrate is +2 volts higher than the platinum electrode. An average illumination is set 70 W/cm$^2$. The ratio of the maximum and minimum illumination is set 1.69 or less. With this condition, as shown in FIG. 12C, the silicon substrate 162 is etched to form vertical trenches 170 extending toward the back surface of the silicon substrate 162, corresponding to the patterning grooves 166. This first etching process is continued for about 15 minutes.

Figure 12D:
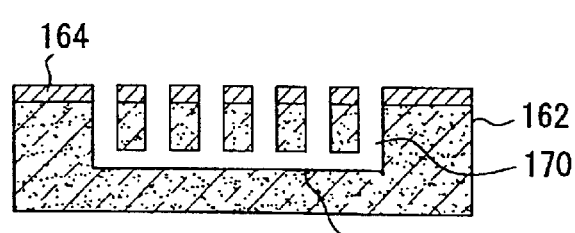
Figure 12E:
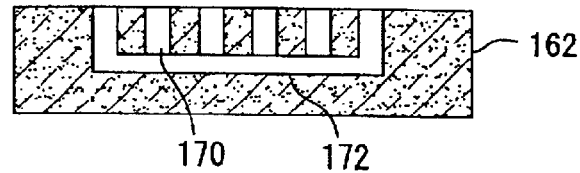

In the second etching process, the average illumination is increased to 200 W/cm$^2$. Other conditions are the same as those in the first etching process. As a result, as shown in FIG. 12D, the leading end portion of the vertical trenches 170 are extended laterally to form lateral trenches 172, which results in the individual deformable portions 156.

Finally, if necessary, the nitride silicon layer 164 is removed by etching, for example. Although one product 158 is illustrated in FIGS. 11 and 12A–12E for clarity, a number of products 158 may be formed simultaneously in one silicon substrate. In this instance, after the piezoelectric resistances are provided on the deformable portions, the acceleration sensors are divided into pieces by dicing, for example.

Also, for the acceleration sensor, a typical thickness of the deformable portion may be about 20 μm. However, it may be varied to obtain different acceralation sensors with different sensitivities. Simply by controlling the etching period for the first and/or the second etching, the thickness can be varied.

As described above, by the use of the electrochemical etching method, a number of sensors can be manufactured in one wafer. Also, a product with a complicated structure can be made through one etching including first and second etching processes, reducing the manufacturing time and cost of the products considerably.

Naturally, the above etching is used in the manufacturing not only of the acceleration sensors but also of other devices including products with a complicated shape.

Ninth Embodiment

Figure 13:
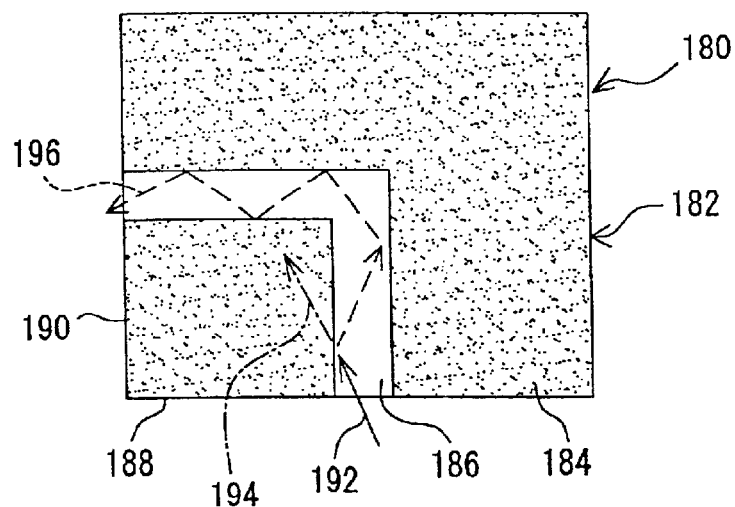
FIG. 13 is a perspective view of an optical guide member manufactured by the electrochemical etching method according to the ninth embodiment.

FIG. 13 shows a light conducting member 180 manufactured by the electrochemical etching system of the present invention. The light conducting member 180 has a product 182 made of one n-type silicon substrate. In this embodiment, the product 182 is in the form of substantially rectangular plate including a first region or lattice structure 184 in which a number of small pores are formed at regular intervals (e.g., in a lattice) and a light conducting passage 186 running across the lattice structure 184. Although the light conducting passage 186 extends in the form of L from one side surface 88 to another side surface 190, it is not limited thereto.

The light conducting member 180 uses a feature of the lattice structure 188, which selectively eliminates light having a wavelength corresponding to the pitch of the pores. The feature is introduced in the Journal of Applied Physics, Vol. 66 25, pp. 3254–3256. With this light conducting member 180, when light 192 is guided into an one end of the light conducting passage 186 in the side surface 188, light 194 except for a part of light having a wavelength corresponding to the size of the lattice is transmitted through the lattice structure 184. The part of light 196, which is prohibited from passing through the lattice structure 184, is guided by the light conducting passage 186 and then fed out of the other end of the passage 186 in the side surface 180. As described above, only the part of light having the specific wavelength is selectively extracted.

Figure 14A:
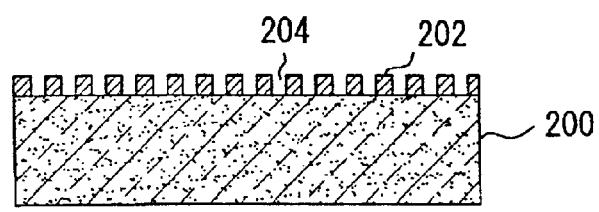
FIGS. 14A to 14E are drawings for describing process of the electrochemical etching method according to the ninth embodiment.
Figure 14B:
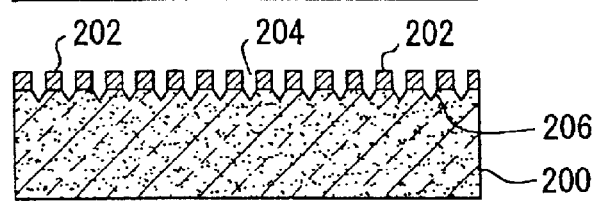

Referring next to FIGS. 14A to 14E, descriptions will be made to a process for manufacturing the product 182 from a silicon substrate. First, an n-type silicon substrate 200 having a certain thickness is prepared (FIG. 14A). Then, a nitride silicon layer 202 is deposited on one surface of the n-type silicon substrate 200 by the chemical vapor deposition (CVD), for example. Next, portions of the layer, corresponding to the pores in the lattice structure 184, are removed by a photolithography, for example, forming a pattern of pores. In the drawing, concave portions formed by the removal process are indicated at 204. An interval of the concave portions 204 is about 700 μm. However, the interval may vary depending upon a wavelength of light to be separated. Subsequently, as shown in FIG. 14B, by an wet etching using alkaline solution or a reactive etching, parts of the silicon substrate exposed in the concave portions are formed with pits 206 where a subsequent etching will be initiated therefrom.

The silicon substrate 200 with the nitride silicon layer 202 is mounted on the electrochemical etching system for the etching of the silicon substrate 200. At this moment, the silicon substrate 200 is positioned so that the nitride silicon layer 202 and the concave portions 204 oppose the electrolyte, i.e., hydrofluoricacid, so that light is illuminated to the opposite surface of the silicon substrate 200. Platinum is used for the opposing electrode.

Figure 14C:
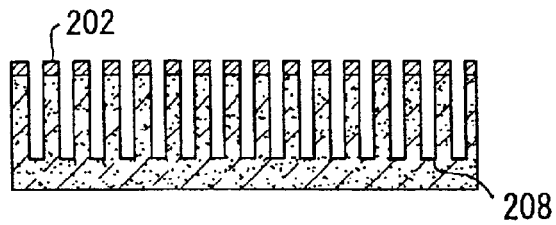

The etching is performed in two steps. In the first etching process, the platinum electrode and the silicon substrate are biased so that the silicon substrate is +2 volts higher than the platinum electrode. An average illumination is set 40 W/cm$^2$. The ratio of the maximum and minimum illumination is set 1.69 or less. This causes that, as shown in FIG. 14C, the vertical pores 208 each having a depth of about 100μm are extended in the silicon substrate 200, corresponding to the pore pattern.

Figure 14D:
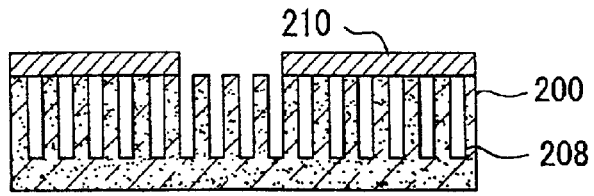
Figure 14E:
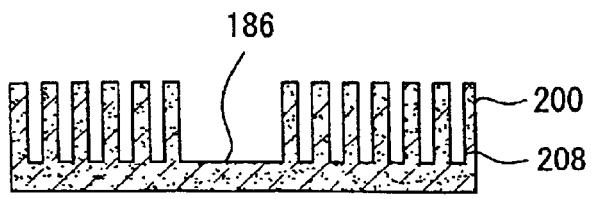

Before the second etching process, the silicon substrate 200 is removed from the electrochemical etching system. As shown in FIG. 14D, the nitride silicon layer is eliminated from the silicon substrate 200 and then a metal layer, e.g., aluminum layer 210, is deposited by the physical or chemical vapor deposition, e.g., sputtering, instead. Also, a part of the aluminum layer corresponding to the light conducting passage 186 is removed.

In the second etching process, portions of the silicon substrate 200, not coated with the aluminum layer 210, are etched by the reactive ion etching. This results in the lattice structure 184 with pores 208 and the light conducting passage 186 running across the lattice structure 184.

With the light conducting member 180 in which pores are formed in a lattice, light having a wavelength of 1.5 μm is selectively extracted. Another light conducting member capable of extracting light with a different wavelength is obtained by changing the interval and/or the size of the pores. Also, by the use of the above-described electrochemical etching method, another light conducting member having a larger area can be obtained.

Although there has been described several embodiments in accordance with the present invention, it will be appreciated that the invention is not limited thereto. Accordingly, any and all modifications, variations, or equivalent arrangements which may occur to those skilled in the art should be considered to be within the scope of the present invention as defined in the appended claims.

What is claimed is:

1. An electrochemical etching system, comprising:

a container for an etching bath and for holding an n-type silicon substrate so that a first surface of said silicon substrate contacts hydrofluoric acid in the etching bath;

an electrode positioned in the hydrofluoric acid;

a power source having a positive terminal connected to the silicon substrate and a negative terminal connected to the electrode; and an illumination unit having a light source for illumination of a second surface of the silicon substrate with an illumination intensity of at least 10 mW/cm$^2$ and including a illumination controller for controlling the illumination of the second surface of the silicon substrate.

2. The electrochemical etching system in accordance with claim 1, wherein a ratio of a maximum illumination to a minimum illumination of the second surface of the silicon substrate is no more than 1.69:1.

3. The electrochemical etching system in accordance with claim 1, further comprising:

a reference electrode positioned in the hydrofluoric acid; and a voltage meter electrically connected between said reference electrode and the silicon substrate.

4. The electrochemical etching system in accordance with claim 1, wherein said illumination controller controls quantity of light emitted from said light source.

5. The electrochemical etching system in accordance with claim 1, wherein said illumination controller includes a modulator, said modulator being connected between said light source and the silicon substrate for modulating the light emitted from said light source.

6. The electrochemical etching system in accordance with claim 1, further comprising:

a current detector for detecting an electric current supplied from said power source to the silicon substrate; and an electric circuit for controlling quantity of the light emitted from said light source based upon the electric current detected by said current detector.

7. The electrochemical etching system in accordance with claim 1, further comprising a unit for retaining a stable quality of the hydrofluoric acid.

8. An electrochemical etching system comprising:

a container for an etching bath and for holding an n-type silicon substrate so that a first surface of said silicon substrate contacts hydrofluoric acid in the etching bath;

an electrode positioned in the hydrofluoric acid;

a power source having a positive terminal connected to the silicon substrate and a negative terminal connected to the electrode;

an illumination unit having a light source for illumination of a second surface of the silicon substrate with an illumination intensity of at least 10 mW/cm$^2$; and a metal plate positioned on the second surface of the silicon substrate, said metal plate having a plurality of openings arranged uniformly for transmitting the light emitted from said illumination unit toward the second surface of the silicon substrate.

9. The electrochemical etching system in accordance with claim 8, wherein said metal plate is electrically conductive and mounted on the second surface of the silicon substrate.

10. The electrochemical etching system in accordance with claim 9, wherein said metal plate is integrally formed on the second surface of the substrate.

11. The electrochemical etching system in accordance with claim 9, wherein said metal plate is independently formed on the second surface of the substrate.

12. The electrochemical etching system in accordance with claim 8, wherein a part of said metal plate remaining between neighboring openings has a width larger than a thickness of the silicon substrate.

13. An electrochemical etching method comprising:

placing a first surface of an n-type silicon substrate in contact with an electrolyte, arranging a metal plate on a second surface of the silicon substrate, the metal plate having a plurality of openings arranged uniformly, illuminating the second surface of the silicon substrate through the openings with an illumination intensity of at least 10 mW/cm$^2$, and controlling an etching current with the illumination of the second surface to form a pore or trench in the first surface of the silicon substrate.

14. The electrochemical etching method in accordance with claim 13, wherein a ratio of a maximum illumination to a minimum illumination of the second surface of the silicon substrate is no more than 1.69:1.

15. A product manufactured by the electrochemical etching method in accordance with claim 13.

16. An electrochemical etching method comprising:

placing a first surface of an n-type silicon substrate in contact with an electrolyte;

illuminating a second surface of the silicon substrate with a first illumination intensity of at least 10 mW/cm$^2$, controlling an etching current with the illumination of the second surface to form pores or trenches in the first surface of the silicon substrate extending toward the second surface of the silicon substrate; and thereafter illuminating the second surface of the silicon substrate with a second illumination intensity, higher than the first illumination intensity, to extend the pores or trenches laterally to connect the pores or trenches to each other.

* * * * *